(12) United States Patent
Saari et al.

(10) Patent No.: US 11,888,498 B2
(45) Date of Patent: Jan. 30, 2024

(54) ELIMINATION OF PROBABILITY OF BIT ERRORS IN SUCCESSIVE APPROXIMATION REGISTER (SAR) ANALOG-TO-DIGITAL CONVERTER (ADC) LOGIC

(71) Applicant: Analog Devices International Unlimited Company, Limerick (IE)

(72) Inventors: Daniel H. Saari, Gloucester (CA); Lewis F. Lahr, Dover, MA (US)

(73) Assignee: Analog Devices International Unlimited Company, Limerick (IE)

( * ) Notice: Subject to any disclaimer, the term of this patent is extended or adjusted under 35 U.S.C. 154(b) by 61 days.

(21) Appl. No.: 17/578,253

(22) Filed: Jan. 18, 2022

(65) Prior Publication Data

US 2023/0231569 A1 Jul. 20, 2023

(51) Int. Cl.
*H03M 1/38* (2006.01)
*H03M 1/46* (2006.01)

(52) U.S. Cl.
CPC .................... *H03M 1/466* (2013.01)

(58) Field of Classification Search
CPC ...... H03M 1/125; H03M 1/462; H03M 1/468; H03M 1/38; H03M 1/12; H03M 1/46; H03M 1/1009; H03M 1/466; H03M 1/804; H03M 1/0624; H03M 1/00; H03M 1/0697; H03M 1/10; H03M 1/1033; H03M 1/40; H03M 1/1245
USPC .................... 341/155, 161, 118, 120
See application file for complete search history.

(56) References Cited

U.S. PATENT DOCUMENTS

| | | | |
|---|---|---|---|
| 5,819,051 A | 10/1998 | Murray et al. | |
| 7,158,596 B2 | 1/2007 | Knapp et al. | |
| 7,212,143 B1 * | 5/2007 | Confalonieri | H03M 1/1225 341/161 |
| 7,272,202 B2 | 9/2007 | Knapp et al. | |

(Continued)

FOREIGN PATENT DOCUMENTS

| | | | |
|---|---|---|---|
| CN | 116470912 A | 7/2023 | |
| WO | WO-2022059068 A1 * | 3/2022 | ............. H03K 19/21 |

OTHER PUBLICATIONS

Choo et al., *Area-Efficient 1GS/s 6b SAR ADC with Charge-Injection-Cell-Based DAC*, ISSCC 2016, Session 27, Hybrid and Nyquist Data Converters, 27.3, 3 pages.

(Continued)

*Primary Examiner* — Linh V Nguyen
(74) *Attorney, Agent, or Firm* — Schwegman Lundberg & Woessner, P.A.

(57) ABSTRACT

Systems and methods related to successive approximation register (SAR) analog-to-digital converters (ADCs) are provided. A method for performing successive approximation registers (SAR) analog-to-digital conversion includes comparing, using a comparator, a first digital-to-analog (DAC) output voltage to a sampled analog input voltage to generate a comparison result including a first positive output and a first negative output; and gating, using gating logic circuitry, at least one of the first positive output or the first negative output of the comparator to next logic circuitry, the gating based at least in part on a digital feedback comprising information associated with at least one of an opposite polarity of the first positive output or an opposite polarity of the first negative output.

19 Claims, 7 Drawing Sheets

(56) References Cited

U.S. PATENT DOCUMENTS

| | | | |
|---|---|---|---|
| 7,315,551 B2 | 1/2008 | Olson et al. | |
| 7,395,362 B2 | 7/2008 | Drexler et al. | |
| 7,539,804 B2 | 5/2009 | Miura | |
| 7,685,449 B2 | 3/2010 | Terasawa | |
| 7,707,437 B2 | 4/2010 | Berenbaum et al. | |
| 7,802,036 B2 | 9/2010 | Takeuchi | |
| 7,966,379 B2 | 6/2011 | Berenbaum et al. | |
| 8,147,338 B2 | 4/2012 | Hutchison-Kay | |
| 8,156,274 B2 | 4/2012 | Kapelner | |
| 8,185,759 B1 | 5/2012 | Li et al. | |
| 8,600,583 B2 | 12/2013 | Fervel et al. | |
| 8,615,091 B2 | 12/2013 | Terwal | |
| 8,667,194 B2 | 3/2014 | Dybsetter et al. | |
| 8,745,305 B2 | 6/2014 | Toba et al. | |
| 8,806,083 B2 | 8/2014 | Doorenbos | |
| 8,873,659 B2 | 10/2014 | Wang et al. | |
| 8,957,802 B1 * | 2/2015 | Evans | H03M 1/0863 |
| | | | 341/161 |
| 8,987,933 B2 | 3/2015 | Yu | |
| 9,484,945 B1 * | 11/2016 | Wan | H03M 1/0863 |
| 9,584,144 B1 * | 2/2017 | Zhou | H03M 1/462 |
| 9,621,179 B1 * | 4/2017 | Maulik | H03M 1/0863 |
| 9,685,973 B2 * | 6/2017 | Liu | H03M 1/38 |
| 9,774,337 B1 * | 9/2017 | Chao | H03K 5/24 |
| 10,374,583 B1 | 8/2019 | Olejarz et al. | |
| 10,649,945 B1 | 5/2020 | Geerling et al. | |
| 2012/0093342 A1 | 4/2012 | Rupprecht et al. | |
| 2013/0124763 A1 | 5/2013 | Kessler | |
| 2013/0285844 A1 * | 10/2013 | Lin | H03M 1/12 |
| | | | 341/110 |
| 2014/0025999 A1 | 1/2014 | Kessler | |
| 2014/0095750 A1 | 4/2014 | Tailliet | |
| 2014/0101351 A1 | 4/2014 | Hooper et al. | |
| 2014/0101477 A1 | 4/2014 | Patterson | |
| 2014/0223054 A1 | 8/2014 | Hasan et al. | |
| 2014/0281077 A1 | 9/2014 | Biskup | |
| 2014/0281078 A1 | 9/2014 | Biskup | |
| 2014/0281079 A1 | 9/2014 | Biskup | |
| 2014/0362865 A1 | 12/2014 | Chini et al. | |
| 2015/0008960 A1 | 1/2015 | Lahr | |
| 2015/0009050 A1 | 1/2015 | Lahr et al. | |
| 2015/0032599 A1 | 1/2015 | Agapitov | |
| 2015/0263755 A1 * | 9/2015 | Confalonieri | H03M 1/1023 |
| | | | 341/120 |
| 2015/0301968 A1 | 10/2015 | Kessler | |
| 2015/0365754 A1 | 12/2015 | Perl | |
| 2016/0034416 A1 | 2/2016 | Chavez et al. | |
| 2016/0034417 A1 | 2/2016 | Chavez et al. | |
| 2016/0041941 A1 | 2/2016 | Kessler et al. | |
| 2016/0196817 A1 | 7/2016 | Mortensen et al. | |
| 2017/0220502 A1 | 8/2017 | Kessler et al. | |
| 2017/0222790 A1 | 8/2017 | Hooper et al. | |
| 2017/0222829 A1 | 8/2017 | Kessler | |
| 2017/0308352 A1 | 10/2017 | Kessler | |
| 2018/0060269 A1 | 3/2018 | Kessler | |
| 2019/0131997 A1 * | 5/2019 | Liu | H03M 1/46 |
| 2019/0326919 A1 * | 10/2019 | Pernull | H03M 1/125 |
| 2020/0136858 A1 | 4/2020 | Rotti et al. | |
| 2020/0221362 A1 | 7/2020 | Kessler | |
| 2020/0356521 A1 | 11/2020 | Kessler et al. | |
| 2021/0211156 A1 | 7/2021 | Kessler et al. | |
| 2021/0234548 A1 * | 7/2021 | Tangirala | H03M 1/468 |

OTHER PUBLICATIONS

"European Application Serial No. 22209314.8, Extended European Search Report dated Jun. 19, 23", 12 pgs.

Lu, Yuxiao, et al., "A fast low power window-opening logic for high speed SAR ADC", IEICE Electronics Express vol. 11, No. 14, (Jan. 1, 2014), 20140454-20140454.

Xu, Daiguo, et al., "High-speed and low-power logic for SAR ADC", IEEE 17th International Conference on Communication Technology (ICCT), (Oct. 27, 2017), 1166-1170.

* cited by examiner

ELIMINATION OF PROBABILITY OF BIT ERRORS IN SUCCESSIVE APPROXIMATION REGISTER (SAR) ANALOG-TO-DIGITAL CONVERTER (ADC) LOGIC

TECHNICAL FIELD OF THE DISCLOSURE

The present disclosure generally relates to electronics, and, more specifically, to successive approximation register (SAR) analog-to-digital converters (ADCs).

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a wireless communication device receiver or a base station receiver, an antenna can generate an analog signal based on the electromagnetic waves carrying information/signals in the air. The analog signal generated by the antenna can then be provided as input to an ADC to generate a digital output signal for further processing.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
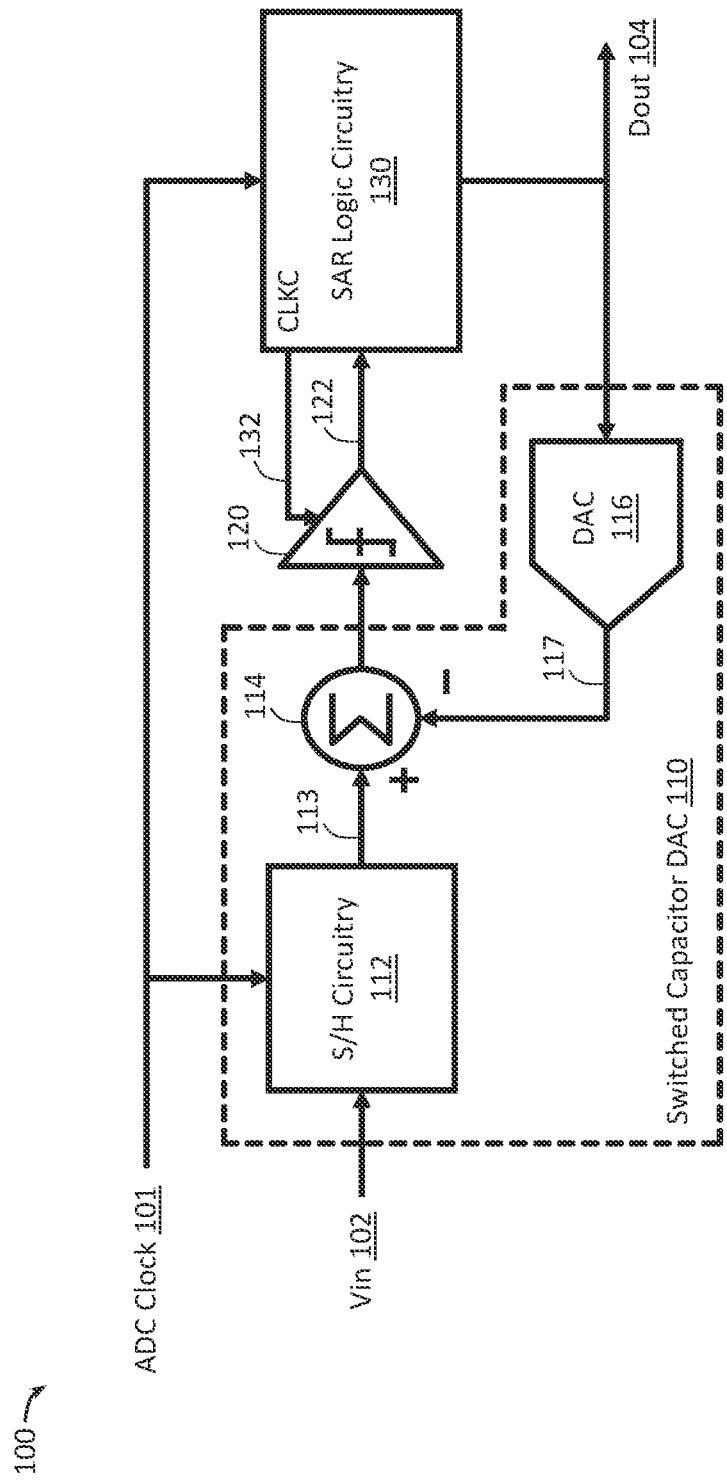
FIG. 1 is a schematic block diagram illustrating an exemplary successive approximation register (SAR) analog-to-digital converter (ADC)

The systems, methods, and devices of this disclosure each have several innovative embodiments, no single one of which is solely responsible for all of the desirable attributes disclosed herein. Details of one or more implementations of the subject matter described in this specification are set forth in the description below and the accompanying drawings.

There are various types of ADC architectures, such as successive approximation (SAR) ADC, sigma-delta ADC, pipelined ADC, and flash ADC. Of the various types of ADC architectures, the SAR ADC has long been favored in many applications requiring high speed, low power consumption, and suitably high conversion resolution. A SAR ADC may implement a binary search algorithm to convert an analog input voltage into a digital code (e.g., an N-bit value). To perform the binary search, the SAR ADC may perform successive comparisons of an analog input voltage to a series of analog test voltages (e.g., digitally-controlled test voltages) and using the result from each comparison to generate a digital code to represent a magnitude of the analog input voltage. Each comparison may be associated with a different bit within the N-bit digital code value. To that end, the SAR ADC may include sample-and-hold (S/H) circuitry to acquire a sample of the analog input voltage and hold the sampled analog input voltage to a constant value for the successive comparisons, a digital-to-analog-converter (DAC) to generate the analog test voltages, a comparator to compare the sampled analog input voltage to each of the analog test voltages, and SAR logic circuitry (e.g., digital circuitry) to control the generation of the digital code based on each of the comparison results.

To generate the digital code, the SAR logic circuitry may take the output of the comparator, record a bit value (for the N-bit value) according to the output of the comparator, and using the recorded value to update the DAC for a next iteration of the binary search (or bit trial). In some examples, for each comparison, the comparator may generate two outputs, one for a positive result and another one for a negative result while the SAR logic circuitry may generate the same number of outputs as the conversion resolution (e.g., N bits). To track which one of the comparator's outputs belongs to which bit of the N-bit value, the SAR logic circuitry may utilize a shift register to window the comparator's outputs to the correct SAR logic circuitry output (e.g., setting a value for a bit within the N-bit value). A forbidden (or illegal) state may exist in the SAR logic circuitry in which the same SAR logic output (a bit within the N-bit value) cannot be written to twice as it would cause not only the bit being overwritten to be erroneous but all subsequent bits to be erroneous. As used herein, a bit error in the SAR logic circuitry due to the forbidden state may also be referred to as a probabilistic error.

The forbidden state may be triggered when the SAR ADC is pushed to operate at a high speed (e.g., with a sampling rate of hundreds of megahertz (MHz)). For instance, when the SAR ADC is clocked at a high speed, the edges of the clock signals and/or the windowing signal (e.g., shift register output) in the SAR logic circuitry can become rounded (e.g., a slow-roll off transition from a logic high to a logic low, or vice versa). There are various techniques that may be used to minimize the occurrences of the forbidden state. For example, the edge rate of the shift register output can be improved using additional circuitry. However, this may only reduce the probability of the forbidden state from occurring and does not eliminate the occurrences of the forbidden state. Further, the additional circuitry can increase cost, power, and/or area for the SAR ADC. In another example, the SAR logic circuitry may utilize flops in the main signal path of the SAR logic circuitry to better gate various circuit decisions. However, flops may have a large propagation delay, and thus may limit the speed at which the SAR logic circuitry can operate. Accordingly, technique improvements for SAR logic circuitry can be beneficial.

The present disclosure describes mechanisms for providing a high-speed SAR ADC in a manner that can eliminate the probability of SAR logic circuitry from writing a logical value to the same conversion result twice, for example, by logically gating the SAR ADC's comparator outputs using opposite polarity information. That is, the positive output of the comparator may be gated by a digital result associated with a negative output of the comparator, and the negative output of the comparator may be gated by a digital result associated with a positive output of the comparator in a feedback manner. One aspect of the present disclosure provides a SAR ADC including a DAC, a comparator, and SAR logic circuitry. The DAC may generate a first DAC output voltage based on a digital output code (e.g., a test value) associated with an analog input voltage (e.g., a sample analog input voltage). The comparator may compare the first DAC output voltage to the analog input voltage to generate a comparison result including a positive output and a negative output. The SAR logic circuitry may include first logic circuitry and second logic circuitry downstream of the first logic circuitry. The first logic circuitry may gate at least one of the first positive output or the first negative output of the comparator to the second logic circuitry based at least in part on a digital feedback. The digital feedback may include information associated with at least one of an opposite polarity of the first positive output or the first negative output. In some aspects, the second logic circuitry may include latching circuitry and/or reset circuitry, and the digital feedback may correspond to an output downstream of the reset circuitry.

The first positive output and the first negative output from the comparator may be associated with a current bit trail, and the digital feedback may be associated with a previous bit trial. For instance, the digital feedback may include an output of the second logic circuitry, where the output is responsive to at least one of a second positive output or a second negative output of the comparator. In this regard, for the previous bit trial, the DAC may generate a second DAC output voltage based on a previous digital output code (e.g., a previous test value) associated with the analog input voltage, and the comparator may compare the second DAC output voltage to the analog input voltage to generate a comparison result including the second positive output and the second negative output. In some aspects, as part of the gating, the first logic circuitry may gate the first positive output of the comparator to the second logic circuitry based on the first positive output having a logic one value and the digital feedback indicating the output responsive to the second negative output of the comparator also has a logic one value. In some aspects, as part of the gating, the first logic circuitry may gate the first negative output of the comparator to the second logic circuitry based on the first negative output having a logic one value and the digital feedback indicating the output responsive to the second positive output of the comparator also has a logic one value.

In some aspects, the SAR logic circuitry may include a shift register that generates output clock pulses, for example, to track the bit position within the digital output code for each bit trial. The occurrences of the forbidden state may be caused by a shift register output clock pulse for a previous bit trial partially overlaps with a shift register output clock pulse for a current bit trial and remains active when the comparator outputs a comparison result for the current bit trial. Accordingly, in some aspects, the gating of the comparator output (e.g., the positive output and the negative output) to the second logic circuitry may be based on a detection of a shift register output clock pulse associated with the previous bit trial remaining active after the comparator generated the first positive output and the first negative output for the current bit trial.

In some aspects, the first logic circuitry (e.g., the gating circuitry) may include a NOT-AND (NAND) gate with three inputs. For instance, the NAND gate may include a first input to receive the first positive output of the comparator, a second input to receive the digital feedback, and a third input to receive a shift register output clock pulse.

In some aspects, the SAR logic circuitry may further include asynchronous clock generation circuitry to generate a first comparator clock pulse for the previous bit trial and generate a second comparator clock pulse for the current bit trial, where the second comparator clock pulse may be generated in response to a completion of the previous bit trial.

The systems, schemes, and mechanisms described herein advantageously enable a SAR ADC to operate at a high speed (e.g., about 100 MHz, 160 MHz, 200 MHz, 220 MHz or more) without the probability of entering a forbidden state. Further, adding the digital feedback circuitry may not increase the SAR logic circuitry complexity, power, area, and/or cost significantly. Accordingly, the disclosed embodiments can provide an efficient and effective solution to eliminate the forbidden state from the SAR logic circuitry. The disclosed SAR ADC may be suitable for use in a wide variety of applications such as audio, wireless communications, instrumentations, energy, health and diagnostic, etc.

Example SAR ADC

FIG. 1 is a block diagram illustrating an SAR ADC 100. The SAR ADC 100 may be used for a broad range of applications, such as audio, communications, energy, healthcare, instrumentation and measurement, motor and power control, industrial automation, and/or aerospace/defense, to convert analog signals to digital values, which can be used for further digital processing. As shown, the SAR ADC 100 may include a switched capacitor DAC 110, a comparator 120, and SAR logic circuitry 130. The switched capacitor DAC 110 may include S/H circuitry 112, a signal summer 114, and a DAC 116. At a high level, the SAR ADC 100 may receive an analog input voltage 102 shown as Vin and generate a digital representation (e.g., a digital output code 104 shown as Dout) of the analog input voltage 102 using a binary search algorithm. The SAR ADC 100 may be single-ended or differential. That is, the analog input voltage 102 can be a single-ended voltage (with respect to a ground potential) or a differential voltage. Accordingly, the components of the SAR ADC 100 can be single-ended or differential.

The operations of the SAR ADC 100 may include a sampling phase followed by a conversion phase. During the sampling phase, the S/H circuitry 112 may acquire or capture a sample of the analog input voltage 102 and hold the sampled voltage 113 (e.g., a constant value) during the following conversion phase. During the conversion phase, the SAR ADC 100 may perform conversion one bit at a time by performing a binary search. As such, the SAR ADC 100 may perform N number of bit trials to generate an N-bit digital output code 104 (e.g., represented by <$b_{N=1}$, . . . , $b_0$>). To that end, the SAR logic circuitry 130 may begin with setting an N-bit value (e.g., stored in a register) to a midscale. That is, the MSB (e.g., $b_{N-1}$) of the N-bit value is set to 1 while all other bits of the N-bit value are set to 0. The DAC 116 may receive the N-bit value and output a first test voltage 117 (e.g., of a series of test voltages 117) according to the N-bit value. As an example, the DAC 116 may be provided with a reference voltage $V_{REF}$, and the first test voltage 117 may correspond to $V_{REF}/2$ based on the N-bit value having the MSB set to 1 and all other bits set to 0.

The comparator 120 may compare the sampled voltage 113 to the first test voltage 117 to determine whether the sampled voltage is greater than, or less than the first test voltage 117, for example, by subtracting the first test voltage 117 from the sampled input voltage 113 using the signal summer 114 as shown. In practice, the comparator 120 may have a positive or non-inverting input terminal and a negative or inverting terminal, where the positive input terminal may be coupled to the output of the S/H circuitry 112 and the negative input terminal may be coupled to the output of the DAC 116. That is, the signal summer 114 may be implemented as part of the comparator 120. For the comparison, if the sampled voltage 113 is greater than the first test voltage 117, the comparator 120 may output a logic high (e.g., a comparison result 122), and the SAR logic circuitry 130 may maintain the logic 1 for the MSB of the N-bit. If, however, the sampled voltage 113 is less than the first test voltage 117, the comparator 120 may output a logic low (e.g., a comparison result 122), and the SAR logic circuitry 130 may clear the MBS of the N-bit value to a logic 0.

Subsequently, the SAR logic circuitry 130 may move on to perform a next bit trial to determine a bit value for the next bit (e.g., $b_{N-2}$) in the N-bit value in a similar way as for the MSB. For instance, the SAR logic circuitry 130 may set the next bit in the N-bit value to a 1, the DAC 116 may generate a second test voltage 117 (e.g., of a series of test voltages 117) based on the updated N-bit value, the comparator 120 may compare the sampled voltage 113 to the second test voltage 117, and the SAR logic circuitry 130 may update the N-bit value according to the comparison result 122 for the second test voltage 117. The bit trial process may continue for each subsequent bit of the N-bit value down to the LSB (e.g., $b_0$). Once the last bit trial for the LSB is completed, the SAR logic circuitry 130 may output the N-bit value as the digital output code 104.

In some aspects, the DAC 116 may include an array of switched capacitors (e.g., binary-weighted capacitors) connected in parallel, where a first end of each of the capacitors may be selectively coupled to the analog input terminal (where Vin is received), $V_{REF}$, or GND, and a second, opposite end of each of the capacitors may be coupled to a common terminal. For instance, the first end may be coupled to three switches, each coupled to a different one of the analog input terminal, $V_{REF}$, or a ground potential (e.g., GND). During the sampling phase, the analog input voltage 102 may be applied to charge the capacitors, for example, the first end of each of the capacitors may be selectively coupled to the analog input terminal of the SAR ADC 100 to receive the analog input voltage 102 and the second end of each of the capacitors may be selectively coupled to the common terminal. The capacitors may be charged to a voltage substantially equal to the analog input voltage 102. After sampling, connections of the capacitors are switched, for example, the first end of each of the capacitors may be selectively coupled to $V_{REF}$ or GND, and the second end may remain coupled to the common terminal. The connections or switches may be controlled using a digital code (e.g., the N-bit value stored in the register) from the SAR logic circuitry 130. Based on the settings or states (open/close) of the switches, the DAC 116 may generate a test voltage 117 at the common terminal. The test voltage 117 at the common terminal may be input to the comparator 120 for comparison against the sampled voltage 113. In other words, after each bit trial, the SAR logic circuitry 130 may set the respective bit of the N-bit value based on the output of the comparator 120, and control the switches or connections of the capacitors by selectively coupling the first end of the capacitor to $V_{ref}$ or GND according to the respective bit value.

As further shown in FIG. 1, the SAR ADC 100 may receive an external ADC clock signal 101 that drives the operations of the S/H circuitry 112. The external ADC clock signal 101 may be configured in a variety of ways. In some examples, the external ADC clock signal 101 may control the sampling period and the conversion period of the SAR ADC 100 and the rate at which the SAR ADC 100 samples the analog input voltage signal 102. The external ADC clock signal 101 may also be provided to the SAR logic circuitry 130. In some instances, the SAR logic circuitry 130 may begin an initial bit trial (e.g., the bit trial for MSB, $b_{N-1}$) based on the ADC clock signal 101, but may generate an asynchronous clock signal 132 (shown as CLKC) internally to latch the output signal of the comparator 120. As such, the asynchronous clock signal 132 may be referred to as a comparator output clock signal. The generation and operations of the comparator output clock signal 132 and the operations of the SAR logic circuitry 130 are discussed more fully below with reference to FIG. 2.

Figure 2:
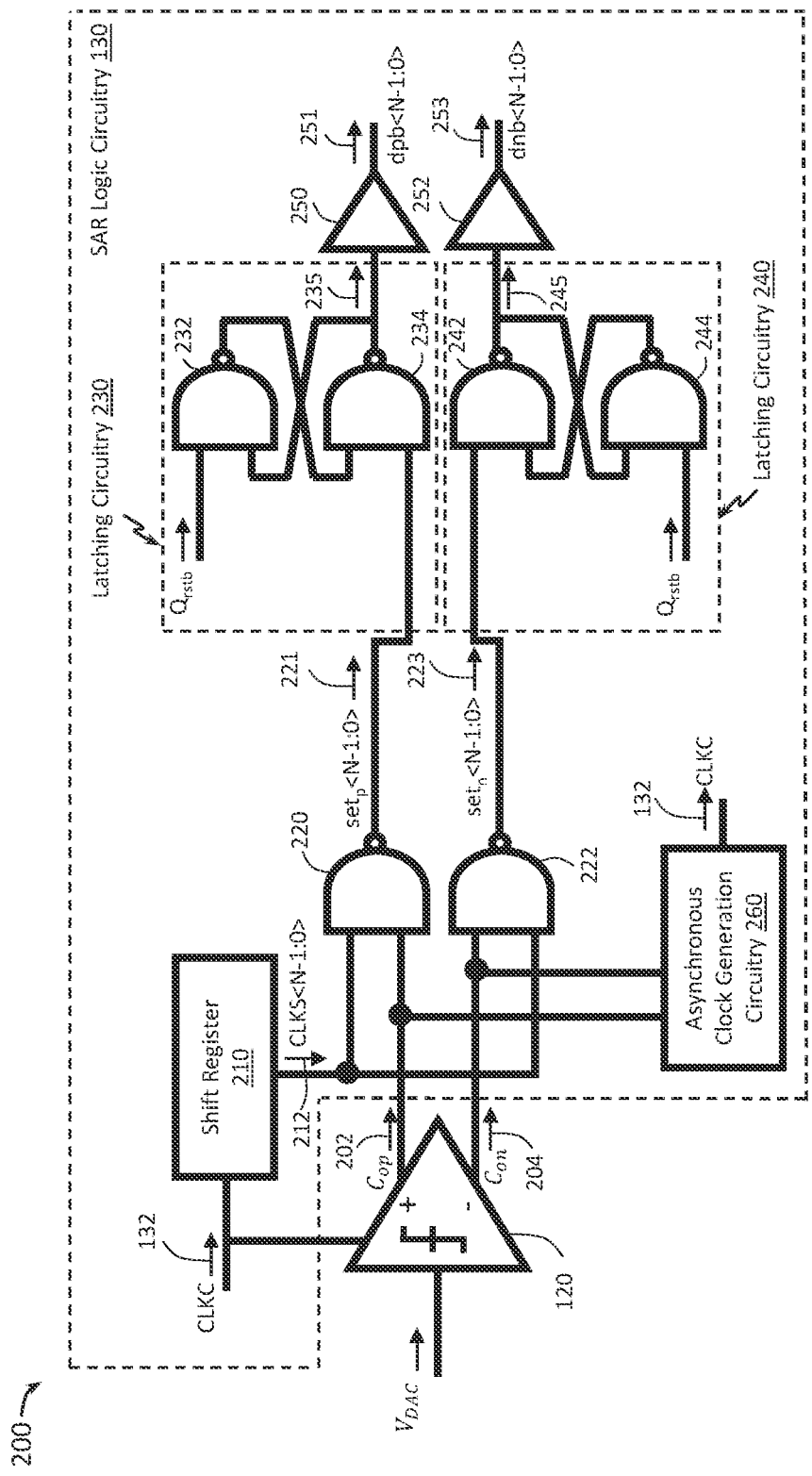
FIG. 2 is a schematic block diagram illustrating an exemplary SAR ADC portion, according to some embodiments of the present disclosure.

FIG. 2 is a schematic block diagram illustrating an exemplary SAR ADC portion 200, according to some embodiments of the present disclosure. The SAR ADC portion 200 may correspond to a portion of the SAR ADC 100 of FIG. 1 and may provide a more detailed view of the SAR logic circuitry 130. As shown in FIG. 2, the SAR logic circuitry 130 may include a shift register 210, asynchronous clock generation circuitry 260, NAND gates 220 and 222 (each with two inputs), latching circuitries 230 and 240, and buffer gates 250 and 252. In order not to clutter the drawings provided in FIG. 2, the SAR logic circuitry 130 is illustrated with circuitries (e.g., the NAND gates 220 and 222, the latching circuitries 230 and 240, and the buffer gates 250 and 252) for generating one bit. However, the SAR logic circuitry 130 can include similar circuitries (e.g., the NAND gates 220 and 222, the latching circuitries 230 and 240, and the buffer gates 250 and 252) for each bit. That is, to provide an ADC resolution of N bits, the SAR logic circuitry 130 may include N number of the circuitry including the NAND gates 220 and 222, the latching circuitries 230 and 240, and the buffer gates 250 and 252 arranged as shown. Further, the SAR logic circuitry 130 can include any suitable number of latching stages, buffering stages, and/or inverting stages, connected to each of the comparator outputs 202 and 204.

As explained above, to generate an N-bit digital output code 104, the SAR logic circuitry 130 may perform N number of bit trials, one for each bit. The SAR logic circuitry 130 may track the bit position within the N-bit value for each bit trial using the shift register 210. Stated differently, the shift register 210 may correlate or associate a certain comparison to a corresponding bit position within the N-bit value. For instance, the shift register 210 may output a series of clock pulses 212, one for each bit trial. The clock signal pulses 212 may be shown as CLKS<N–1:0>, where CLKS<N–1> may represent the clock pulse for the MSB bit trial and CLKS<0> may represent the clock pulse for the LSB bit trial.

The shift register 210 may be implemented using any suitable gates and logic circuitry and may be clocked or driven by the comparator output clock signal 132. For instance, the shift register 210 may output the clock pulse 212 sequentially from CLKS<N–1> to CLKS<0>, each triggered by an assertion (e.g., a rising edge) of the comparator output clock signal 132. In some examples, the shift register 210 may be implemented using a sequence of flops connected in series and clocked by the comparator output clock signal 132. For instance, the shift register 210 may include N number of flops connected in series, and each flop may be sequentially triggered to generate a shift register output clock pulse 212 by a corresponding clock pulse of the comparator output clock signal 132.

For each bit trial (for a $k^{th}$ within the N-bit value), the comparator 120 may compare a DAC output voltage $V_{DAC}$ (e.g., a test voltage 117 output by the DAC 116) to a sampled analog input voltage (e.g., the analog input voltage 102) and generate a comparison result. More specifically, the comparator 120 may output a positive output 202 represented by $C_{op}$ (e.g., at a positive output terminal shown by the "+" symbol) and a negative output 204 represented by $C_{on}$, (e.g., at a negative output terminal shown by the "−" symbol). Each of the positive output 202 and the negative output 204 may be a logic high or a logic low. For instance, a logic high for the positive output 202 may indicate a bit value of 1 for the respective bit, and a logic high for the negative output 204 may indicate a bit value of 0 for the respective bit. Because a bit value can only be 1 or 0, one of the positive output 202 or the negative output 204 may have a logic high, and the other one of the positive output 202 or the negative output 204 may have a logic low under normal operations. That is, the positive output 202 and the negative output 204 may be complementary of each other when the comparator 120 converges to a decision. If both the positive output 202 and the negative output 204 are logic high or both the positive output 202 and the negative output 204 are logic low, it indicates that the comparator 120 cannot converge to a decision and the comparison result is erroneous. The comparator 120 may latch the comparison result to the output terminals according to the comparator output clock signal 132. In this regard, the comparator 120 may perform a comparison upon detecting an assertion (e.g., a rising edge) of a clock pulse in the comparator output clock signal 132, for example, by responding to a difference between the sampled voltage and the DAC output voltage $V_{DAC}$, and may output the comparison result.

As further shown in FIG. 2, the positive output 202 of the comparator 120 and a respective shift register output clock pulse 212 (e.g., CLKS<k>) may be coupled to the inputs of the NAND gate 220. The NAND gate 220 may operate as a latch, gating the positive output 202 to the latching circuitry 230 based on the respective shift register output clock pulse 212. For example, the NAND gate 220 may generating an output 221 represented by $set_p$<k> for the $k^{th}$ bit (e.g., within $set_p$<N−1:0>) when the respective shift register output clock pulse 212 is asserted (a logic high). In a similar way, the negative output 204 of the comparator 120 and the respective shift register output clock pulse 212 (e.g., CLKS<k>) may be coupled to the inputs of the NAND gate 222. The NAND gate 222 may gate the negative output 204 to the latching circuitry 240 based on the respective shift register output clock pulse 212, for example, by generating an output 223 represented by $set_n$<k> for the $k^{th}$ bit (e.g., within $set_n$<N−1:0>) when the respective shift register output clock pulse 212 is asserted. Phrased differently, the NAND gates 220 and 222 may output $set_p$<k> and $set_n$<k>, respectively, for the $k^{th}$ bit upon a completion of the comparison (by the comparator 120) for the $k^{th}$ bit and an assertion of the respective shift register output clock pulse 212. Accordingly, the shift register output clock pulse 212 may operate to window the outputs 202 and 204 of the comparator 120 for a particular bit trial.

The latching circuitry 230 may be coupled to the output of the NAND gate 220. The latching circuitry 230 may receive the output 221 $set_p$<k> from the NAND gate 220 and lock or retain the bit value of $set_p$<k> until a reset is applied to the latching circuitry 230. Similarly, the latching circuitry 240 may be coupled to the output of the NAND gate 222. The latching circuitry 240 may receive the output 223 $set_n$<k> from the NAND gate 222 and lock or retain the bit value of $set_n$<k> until a reset is applied to the latching circuitry 240. In the illustrated example of the FIG. 2, the latching circuitry 230 is implemented using a set-reset (SR) flip-flop or including a pair of cross-coupled 2-input NAND gates 232 and 234. In a similar way, the latching circuitry 240 is implemented as an SR flip-flop including a pair of cross-coupled 2-input NAND gates 242 and 244.

The buffer gate 250 may be coupled to the output of the latching circuitry 230. The buffer gate 250 may receive the latched output 235 (corresponding to $set_p$<k>) and pass the output 235 (e.g., with a delay) to the output 251 represented by dpb<k> for the $k^{th}$ bit (e.g., within dpb<N−1,0>). Similarly, the buffer gate 252 may be coupled to the output of the latching circuitry 240. The buffer gate 252 may receive the latched output 245 (corresponding to $set_n$<k>) and pass the output 245 (e.g., with a delay) to the output 253 represented by dnb<k> for the $k^{th}$ bit (e.g., within dnb<N−1,0>).

Based on the NAND gate 220 operations, $set_p$<k> may be a logic low when the positive output 202 $C_{op}$<k> is a logic high and CLKS<k> is asserted (a logic high). Conversely, $set_p$<k> may be a logic high when the positive output 202 $C_{op}$<k> is a logic low and CLKS<k> is asserted. Similarly, based on the NAND gate 222 operations, $set_n$<k> may be a logic low when the negative output 204 $C_{on}$<k> is a logic high and CLKS<k> is asserted. Conversely, $set_n$<k> may be a logic high when the negative output 204 $C_{on}$<k> is a logic low and CLKS<k> is asserted. The SR flip-flop with the NAND gates 232 and 234 may retain its value when $set_p$<k> is low until a reset (e.g., assertion of $Q_{rstb}$) is applied to the SR flip-flop (meaning that the SR flip-flop is active low). In a similar way, the SR flip-flop with the NAND gates 242 and 244 may retain its value when $set_p$<k> is low until a reset (e.g., assertion of $Q_{rstb}$) is applied to the SR flip-flop. Thus, dpb<k> may be a logic high when $set_p$<k> is a logic low, and dnb<k> may be a logic high when $set_n$<k> is a logic low. Hence, dpb<k> may be a logic high when $C_{op}$<k> is a logic high, and dnb<k> may be a logic high when $C_{on}$<k> is a logic high. Subsequently, the SAR logic circuitry 130 may update the $k^{th}$ bit in the N-bit value (e.g., the test value) and configure the capacitors in the DAC 116, for example, by selectively switching a capacitor corresponding to the $k^{th}$ bit to VREF or GND, according to the output 251 and/or 253. In other examples, the SAR logic circuitry 130 may update the $k^{th}$ bit in the N-bit value (e.g., the test value) and configure the capacitors in the DAC 116 by selectively switching a capacitor corresponding to the $k^{th}$ bit to +VREF or −VREF (e.g., depending on the DAC design) according to the output 251 and/or 253.

As explained above, the comparator output clock signal 132 can be generated internally at the SAR logic circuitry 130. As further shown in FIG. 2, the asynchronous clock generation circuitry 260 may be coupled to the output terminals of the comparator 120. The asynchronous clock generation circuitry 260 may receive the outputs 202 and 204 and may generate the comparator output clock signal 132 based at least in part on the outputs 202 and 204. To that end, after each bit trial, the comparator 120 may be reset, for example, the positive output 202 and the negative output 204 may each be cleared to a logic low. Additionally, each of the latching circuitry 230 and the latching circuitry 240 may be reset, for example, by asserting $Q_{rstb}$ at each of the respective SR flip-flops. After the reset, the asynchronous clock generation circuitry 260 may assert a clock pulse for the comparator output clock signal 132 to begin a new comparison or bit trial.

The assertion of the comparator output clock pulse (a rising edge) may trigger a new comparison output at the comparator 120. The asynchronous clock generation circuitry 260 may monitor the positive output 202 and the negative output 204 of the comparator 120 to determine when the comparator 120 has completed the comparison and converge to a decision. Because both the positive output 202 and the negative output 204 were cleared to a logic low at reset, the asynchronous clock generation circuitry 260 can detect that the comparator 120 has converged to a decision when the positive output 202 transition to a logic high or when the negative output 204 transition to a logic high. Upon detecting a transition at the positive output 202 or the negative output 204 of the comparator 120, the asynchronous clock generation circuitry 260 may de-assert the comparator output clock pulse. After the comparator output clock pulse is de-asserted, the SAR logic circuitry 130 may reset the comparator 120 outputs 202 and 204 and the latching circuitries 230 and 240 as discussed above.

After a certain reset period, the asynchronous clock generation circuitry 260 may assert another clock pulse for the comparator output clock signal 132 to trigger a next bit trial. In some instances, the SAR logic circuitry 130 may further include clock edge detection and delay circuitries to control the duration of the reset period and the assertion of the reset signals $Q_{rstb}$. The timing relationships among the signals (e.g., the comparator output clock signal 132, the shift register output 212, and the outputs 202 and 204 of the comparator 120) in the SAR logic circuitry 130 are discussed more fully below with reference to FIG. 3.

Figure 3:
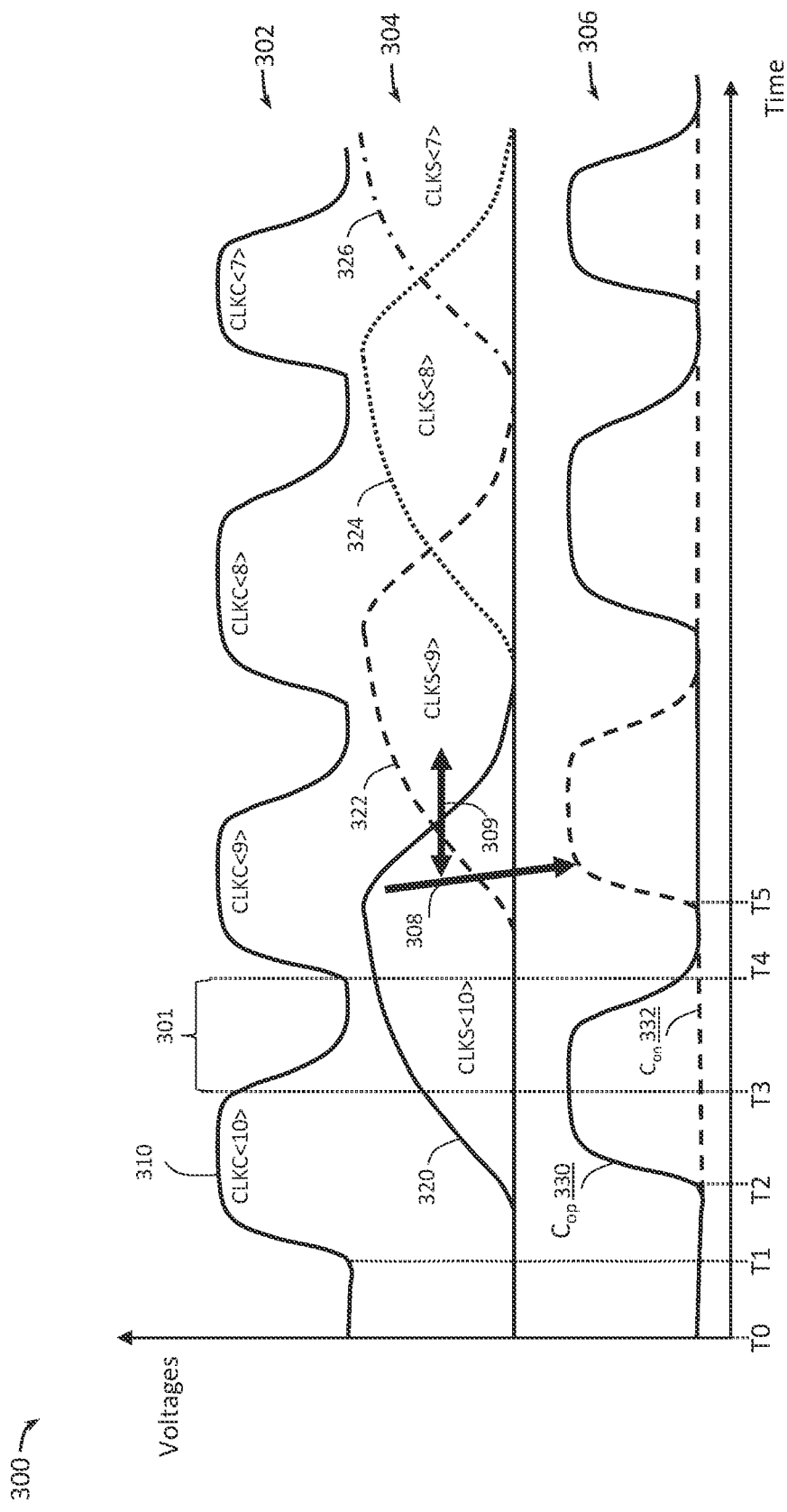
FIG. 3 is a timing diagram illustrating a probabilistic error in a SAR ADC, according to some embodiments of the present disclosure.

As discussed above, as the speed for SAR ADC increases, the edges of the clock signals may become rounded or too slow, causing errors in the conversion. FIG. 3 is a timing diagram 300 illustrating a probabilistic error in a SAR ADC (e.g., at the SAR logic circuitry 130), according to some embodiments of the present disclosure. In FIG. 3, the x-axes may represent timing in some constant units, and the y-axes may represent voltages in some constant units. The graph 302 illustrates an exemplary curve 310 corresponding to a comparator output clock signal 132 of FIG. 1 and/or FIG. 2. The comparator output clock signal 132 may include a series of clock pulses shown as CLKC<10> to CLKC<7>, for example, for testing bit 10 to bit 7, respectively, within the N-bit value (e.g., a test value) discussed above with reference to FIGS. 1 and 2. As an example, N is 11, and thus bit 10 is the MSB. The graph 304 illustrates exemplary curves 320, 322, 324, and 326 corresponding to the shift register output clock pulses 212. For example, the curves 320 (shown by the solid line), 322 (shown by the dashed line), 324 (shown by the dotted line), and 326 (shown by the dashed-dotted line) may correspond to CLKS<10>, CLKS<9>, CLKS<8>, and CLKS<7>, respectively. The graph 306 illustrates exemplary curves 330 (shown by the solid line) and 332 (shown by the dashed line) corresponding to the comparator 120's positive output 202 $C_{op}$ and negative output 204 $C_{on}$, respectively.

As shown, at time T0, both $C_{op}$ and $C_{on}$ are logic low, for example, after the SAR logic circuitry 130 is reset where bit 10 of the test value is set to 1 and all other bits of the test value are set to 0, and the switches for the capacitors in the DAC 116 are configured according to the test value. At time T1, the asynchronous clock generation circuitry 260 may assert CLKC<10>. Upon assertion of CLKC<10>, the comparator 120 may compare a sampled input voltage 113 to a first DAC output voltage (e.g., generated by the DAC 116 with bit 10 set to 1 and all other bits set to 0). After a certain delay, at time T2, the comparator 120 may output a comparison result for bit 10. In the illustrated example of FIG. 3, $C_{op}$ transitions to a logic high and $C_{on}$ remains a logic low indicating that the sampled input voltage 113 is greater than the first DAC output voltage.

As explained above, the shift register 210 is also clocked by the comparator output clock signal 132. As shown in the graph 304, the shift register output clock pulse CLKS<10> for bit 10 may transition to a logic high (e.g., at about time T1) after a certain delay from the assertion of CLKC<10>. When CLKS<10> is a logic high, the NAND gate 220 may output $set_p$ (e.g., a logic 0 corresponding to $C_{op}$ being a logic high for bit 10) and the NAND gate 222 may output $set_n$ (e.g., a logic 1 corresponding to $C_{on}$ being a logic low for bit 10). Subsequently, the outputs $set_p$ and $set_n$ may be passed downstream to the latching circuitries 230 and 240, respectively, and so forth. For example, the buffer gate 250 may output a logic high for dpb<10> and the buffer gate 252 may output a low for dnb<10>. Additionally, the switches for the capacitors in the DAC 116 are configured according to the test value (dpb<10> or dnb<10>). For example, the first end of the capacitor, which may be referred to as $CAP_{b10}$ corresponding to bit 10, may be coupled to $V_{REF}$ based on dpb<10> being a logic 1 and dnb<10> being a logic 0.

At time T3, upon detecting the comparator 120 has completed the comparison for bit 10, the asynchronous clock generation circuitry 260 may de-assert CLKC<10>. After a certain delay from the de-assertion of CLKC<10>, the SAR logic circuitry 130 may reset $C_{op}$ and $C_{on}$ to a logic low. At time T4, after a reset period (e.g., a delay 301), the asynchronous clock generation circuitry 260 may assert CLKC<9> for a next bit trial. The comparison for bit 9 may be performed in a similar way as for bit 10. Upon assertion of CLKC<10>, the comparator 120 may compare a sampled input voltage 113 to a second DAC output voltage (e.g., generated by the DAC 116 with bit 10 remains as 1 and bit 9 updated to 1). After a certain delay, at time T5, the comparator 120 may output a comparison result for bit 9. In the illustrated example, $C_{on}$ transitions to a logic high and $C_{op}$ remains a logic low indicating that the sampled input voltage 113 is lower than the first DAC output voltage. Similar to the shift register output clock pulse CLKS<10>, based on the assertion of CLKC<9> at time T4, the shift register output clock pulse CLKS<9> for bit 9 may be clocked out (e.g., at about time T5).

As can be seen, the edges of the comparator output clock pulses CLKC<10> to CLKC<7> and the shift register output clock pulses CLKS<10> to CLKS<7> are rounded instead of having a sharp transition from a logic low to a logic high at a rising edge or a sharp transition from a logic high to a logic low at the falling edge. The rounding of the clock edges can be problematic. As can be seen, the shift register output clock pulse CLKS<10> partially overlaps with the CLKS<9>. Because CLKS<10> remains active (a logic high) when the comparator 120 completed the comparison for bit 9 (as shown by the arrow 308), the NAND gates 220 and 222 may output $set_p$ and $set_n$, respectively, based on the comparison result ($C_{op}$ and $C_{on}$) for bit 9, but may write those outputs $set_p$ and $set_n$ again for bit 10 instead of for bit 9. This may cause not only an error for bit 10, but all subsequent bits may be erroneous. This error may be referred to as a probabilistic error since the occurrence of such an error is probabilistic (as show by the arrow 309) depending on the amount of overlap between CLKS<10> and CLKS<9> in time and the amount of time that takes the comparator 120 to complete a comparison for bit 9. More specifically, such an error may occur when the SAR logic circuitry 130 in a state (the forbidden state) in which the shift register output clock pulse 212 for the previous bit trial remains active after the comparison for the current bit trial is completed and the comparison result for the current bit trial is opposite of the comparison result for the previous bit trial.

In some instances, the forbidden state can cause a catastrophic failure in the SAR ADC because the switches for the capacitors in the DAC 116 are controlled by the test value. As discussed above, the first end of the capacitor $CAP_{b10}$ corresponding to bit 10 may be switched to connect to $V_{REF}$ based on the comparison result for bit 10. That is, a first switch coupling the first end of the capacitor $CAP_{b10}$ to $V_{REF}$ may be closed. Here, because the comparison result for bit 9 is mistakenly identified as for bit 10 based on CLKS<10> remaining active, the SAR logic circuitry 130 may close a second switch that couples the first end of the capacitor $CAP_{b10}$ to couple to GND. As such, the capacitor $CAP_{b10}$ may be shorted in opposite directions, and in some instances, this can cause the SAR ADC to enter an irrecoverable erroneous state.

While various techniques may be applied (e.g., increasing the clock edge rate and/or using flops instead of NAND gates and SR latches to better gate signals) to reduce the probability of such probabilistic errors, such probabilistic errors cannot be eliminated.

Accordingly, the present application provides techniques and circuitries for detecting and eliminating such probabilistic errors in SAR ADC control logic.

Figure 4:
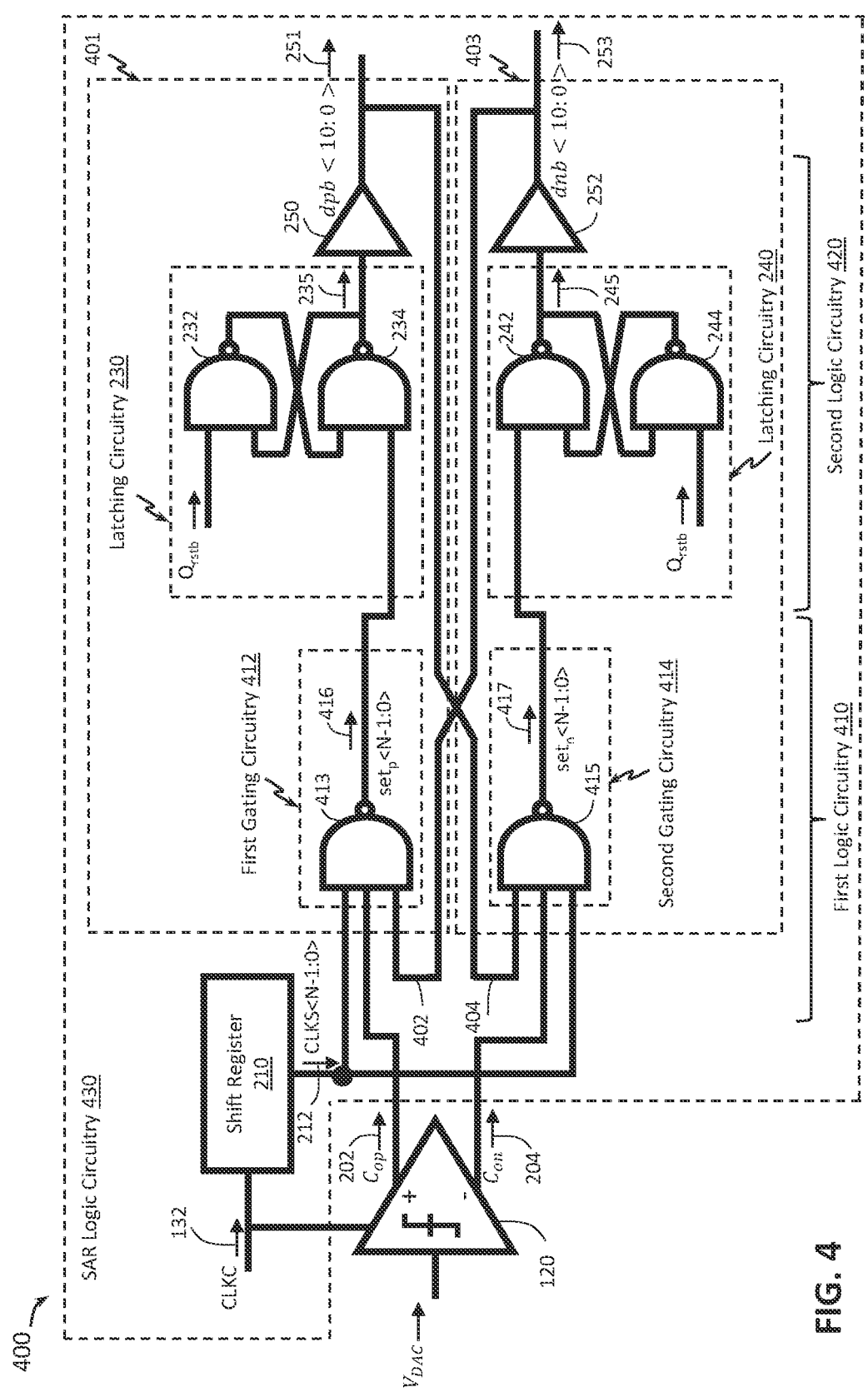
FIG. 4 is a schematic block diagram illustrating an exemplary SAR ADC portion that implements probabilistic error detection and elimination, according to some embodiments of the present disclosure.

FIG. 4 is a schematic block diagram illustrating an exemplary SAR ADC portion 400 that implements probabilistic error detection and elimination, according to some embodiments of the present disclosure. For instance, the SAR ADC portion 400 may correspond to a portion of the SAR ADC 100 of FIG. 1, where the SAR logic circuitry 430 may replace the SAR logic circuitry 130 shown in FIG. 1 and/or FIG. 2. The SAR ADC portion 400 shares many elements with the SAR ADC portion 200 of FIG. 2; for brevity, a discussion of these elements is not repeated, and these elements may take the form of any of the embodiments disclosed herein.

As shown in FIG. 4, the SAR logic circuitry 430 may include a shift register 210, a first digital path 401, and a second digital path 403. The first digital path 401 may be coupled to the positive output terminal (shown by the symbol "+") of the comparator 120 and the output of the shift register 210. The second digital path 403 may be coupled to the negative output terminal (shown by the symbol "−") of the comparator 120 and the output of the shift register 210. The SAR logic circuitry 430 may further include first logic circuitry 410 and second logic circuitry 420 downstream of the first logic circuitry 410. The first logic circuitry 410 may include first gating circuitry 412 in the first digital path 401 and second gating circuitry 414 in the second digital path 403. The second logic circuitry 420 may include latching circuitry 230 and buffer gate 250 in the first digital path 401 and latching circuitry 240 and buffer gate 252 in the second digital path 403.

In order not to clutter the drawings provided in FIG. 4, the SAR logic circuitry 430 is illustrated with circuitries (e.g., the first gating circuitry 412 and the second gating circuitry 414, the latching circuitries 230 and 240, and the buffer gates 250 and 252) for generating one bit. However, the SAR logic circuitry 430 can include similar circuitries (e.g., the first logic circuitry 410 and the second logic circuitry 420) for each bit. That is, to provide an ADC resolution of N bits, the SAR logic circuitry 430 may include N number of the circuitries (e.g., the first logic circuitry 410 and the second logic circuitry 420) arranged as shown. Further, the SAR logic circuitry 430 may include asynchronous clock generation circuitry similar to the asynchronous clock generation circuitry 260 coupled to the outputs 202 and 204 of the comparator 120 and may generate the comparator output clock signal 132 CLKC and the shift register output clock pulses 212 CLKS as discussed above with reference to FIG. 2. Further still, the SAR logic circuitry 430 can include any suitable number of latching stages, buffering stages, and/or inverting stages in the first digital path 401 downstream of the first gating circuitry 412 and/or in the second digital path 403 downstream of the second gating circuitry 414.

In some aspects, the first gating circuitry 412 and the second gating circuitry 414 may detect and eliminate the probabilistic errors discussed above with reference to FIGS. 2 and 3. In this regard, the first gating circuitry 412 may be coupled to the positive output terminal of the comparator 120, the output of the shift register 210, and the output of the second logic circuitry 420 to receive the positive output 202, a shift register output clock pulse 212, and a digital feedback 402, respectively. The digital feedback 402 may include information associated with an opposite polarity of the positive output 202. As shown, the digital feedback 402 may correspond to the output of the buffer gate 252 on the second digital path 403 (coupled to the negative output terminal of the comparator 120). In a similar way, the second gating circuitry 414 may be coupled to the negative output terminal of the comparator 120, the output of the shift register 210, and the output of the second logic circuitry 420 to receive the negative output 204, the shift register output clock pulse 212, and a digital feedback 404, respectively. The digital feedback 404 may include information associated with an opposite polarity of the negative output 204. As shown, the digital feedback 404 may correspond to the output of the buffer gate 250 on the first digital path 401 (coupled to the positive output terminal of the comparator 120). In general, the digital feedback 402 may be taken from any node subsequent to reset circuitry (e.g., the latching circuitry 240 with the reset $Q_{rstb}$) on the second digital path 403, and the digital feedback 404 may be taken from any node subsequent to reset circuitry (e.g., the latching circuitry 230 with the reset $Q_{rstb}$) on the first digital path 401.

As explained above with reference to FIG. 3, a probabilistic error (or a forbidden state) may occur when the shift register output clock pulse 212 (e.g., CLKS<10>) for the previous bit trial remains active after the comparison for the current bit trial is completed and the comparison result for the current bit trial is opposite of the comparison result for the previous bit trial. The first gating circuitry 412 may utilize the digital feedback 402 to detect whether the forbidden state has occurred and gate the positive output 202 to the second logic circuitry 420 upon detecting the forbidden state. Similarly, the second gating circuitry 414 may utilize the digital feedback 404 to detect whether the forbidden state has occurred and gate the negative output 204 to the second logic circuitry 420 upon detecting the forbidden state. In the illustrated example of FIG. 4, the first gating circuitry 412 may be implemented using a 3-input NAND gate 413, for example, having a first input to receive a positive output 202, a second input to receive a shift register output clock pulse 212, and a third input to receive information (e.g., the digital feedback 402) associated with an opposite polarity of the positive output 202. In a similar way, the second gating circuitry 414 may be implemented using a 3-input NAND gate 415, for example, having a first input to receive a negative output 204, a second input coupled to receive the shift register output clock pulse 212, and a third input to receive information (e.g., the digital feedback 404) associated with an opposite polarity of the negative output 204.

The addition of the digital feedback 402 as an input to the NAND gate 413 can prevent the SAR logic circuitry 430 from writing to a certain bit in the N-bit value (for a certain bit trial) twice. Similarly, the addition of the digital feedback 404 as an input to the NAND gate 415 can prevent the second gating circuitry 414 from writing to a certain bit in the N-bit value (for a certain bit trial) twice. Stated differently, if the SAR logic circuitry 430 had already written a comparison result to the downstream second logic circuitry 420 for a certain bit trial, the SAR logic circuitry 430 may not write another comparison result to the downstream second logic circuitry 420. Accordingly, the 3-input NAND gate 413 (e.g., the first gating circuitry 412) and the 3-input NAND gate 415 (e.g., the second gating circuitry 414) can detect and eliminate the probabilistic error or the forbidden state in the first digital path 401 and the second digital path 403, respectively.

While FIG. 4 illustrates the first gating circuitry 412 implemented using the 3-input NAND gate 413 and the second gating circuitry 414 implemented using the 3-input NAND gate 415, the first gating circuitry 412 and the second gating circuitry 414 may be implemented using any suitable logics and gates. In general, the first logic circuitry 410 may receive a first positive output 202 and a first negative output 204 for a current bit trial (e.g., for $b_k$). The first logic circuitry 410 may gate the first positive output 202 to the second logic circuitry based on an output of the second logic circuitry 420 responsive to a second negative output 204 for a previous bit trial (e.g., for $b_{k-1}$). In a similar way, the first logic circuitry 410 may gate the first negative output 204 to the second logic circuitry based on an output of the second logic circuitry 420 responsive to a second positive output 202 for a previous bit trial (e.g., for $b_{k-1}$).

Figure 5:
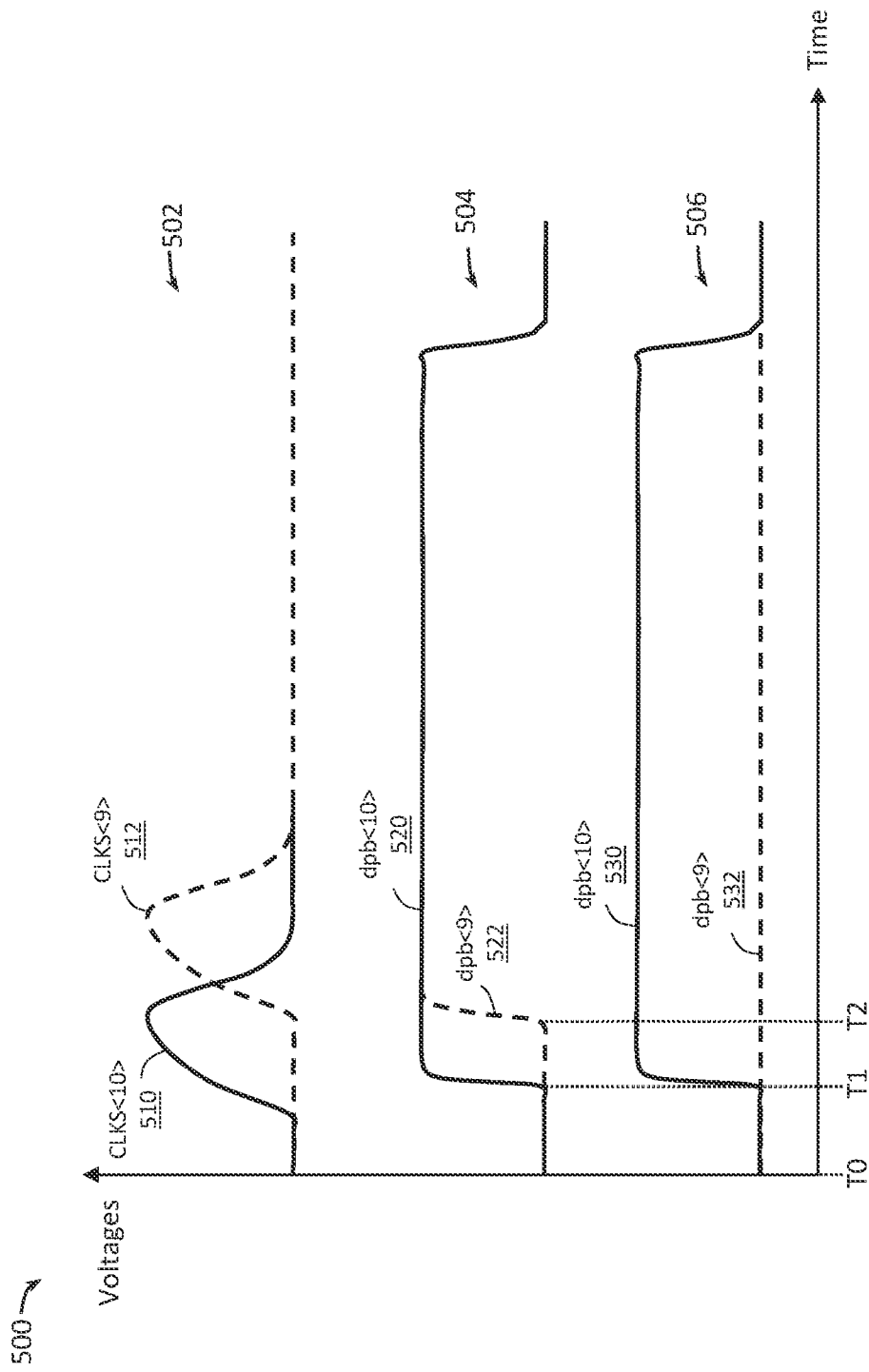
FIG. 5 is a timing diagram illustrating SAR ADC control signals and bit signals without probabilistic error detection and elimination, according to some embodiments of the present disclosure.

FIG. 5 is discussed in relation to FIGS. 2 and 4 to illustrate the benefits of utilizing the digital feedbacks 402 and 404 in the SAR logic circuitry 430. FIG. 5 is a timing diagram 500 illustrating SAR ADC control signals and bit signals with and without probabilistic error detection and elimination, according to some embodiments of the present disclosure. In FIG. 5, the x-axes may represent timing in some constant units, and the y-axes may represent voltages in some constant units. The graph 502 illustrates exemplary curves 510 and 512 corresponding to the shift register output clock pulses 212. For example, the curves 510 (shown by the solid line) and 512 (shown by the dashed line) may correspond to CLKS<10> for bit 10 (e.g., $b_{10}$) and CLKS<9> for bit 9 (e.g., $b_9$), respectively, of a 11-bit test value (e.g., $[b_{10}, \ldots, b_0]$) for bit trials in the SAR logic circuitry 130 of FIGS. 1 and 2 and/or the SAR logic circuitry 430 of FIG. 4, respectively. The graph 504 illustrates exemplary curves 520 (shown by the solid line) and 522 (shown by the dashed line) corresponding to the output 251 dpb<10> (for bit 10 responsive to the comparator 120's positive output 202 $C_{op}$) and the output 253 dnb<10> (for bit 10 responsive to the comparator 120's negative output 204 $C_{on}$), respectively, generated by the SAR logic circuitry 130 of FIG. 2. The graph 506 illustrates exemplary curves 530 (shown by the solid line) and 532 (shown by the dashed line) corresponding to the output 251 dpb<10> (for bit 10 responsive to the comparator 120's positive output 202 $C_{op}$) and the output 253 dnb<10> (for bit 10 responsive to the comparator 120's negative output 204 $C_{on}$), respectively, generated by the SAR logic circuitry 430 of FIG. 4. In order not to clutter the drawings provided in FIG. 5, the comparator output clock signal 132 is not shown. However, the shift register 210 may be clocked by the comparator output clock signal 132 to generate the shift register output clock pulses CLK<10> and CLK<9> and the comparator 120 may be clocked by the comparator output clock signal 132 to generate $C_{op}$ and $C_{on}$ as discussed above with reference to FIGS. 2-4.

As shown, at time T0, both $C_{op}$ and $C_{on}$ are logic low, for example, after the SAR logic circuitry 130 is reset where bit 10 of the test value is set to 1 and all other bits of the test value are set to 0, and the switches for the capacitors in the DAC 116 are configured according to the test value.

At time T1, the comparator 120 may complete comparing a sampled input voltage (e.g., an analog input voltage 102 sampled by the S/H circuitry 112) to a first DAC output voltage (e.g., generated by the DAC 116 with bit 10 set to 1 and all other bits set to 0) and may generate a comparison result for bit 10. As an example, the comparator 120 may determine that the sampled input voltage is greater than the first DAC output voltage. Accordingly, the SAR logic circuitry 130 may output a logic high for dpb<10> and a logic low for dnb<10> as shown by the graph 504, where the curve 520 for dpb<10> transitions to a logic high and the curve 522 for dnb<10> remains a logic low. Similarly, the SAR logic circuitry 430 may output a logic high for dpb<10> and a logic low for dnb<10> as shown by the graph 506, where the curve 530 for dpb<10> transitions to a logic high and the curve 532 for dnb<10> remains a logic low.

Subsequently, the SAR logic circuitry 430 may keep the logic 1 for bit 10 in the test value based on the comparison result and set bit 9 to a 1 for a next bit trial for bit 9. At time T2, the comparator 120 may complete comparing the sampled input voltage to a second DAC output voltage (e.g., generated by the DAC 116 with bit 10 remains as 1 and bit 9 updated to 1) and may generate a comparison result for bit 9. As an example, the comparator 120 may determine that the sampled input voltage is smaller than the second DAC output voltage.

As can be seen from the curve 510, CLKS<10> remains active (e.g., at time T2 due to the rounding or slowing of the clock edges) after the comparison result for bit 9 is ready. The SAR logic circuitry 130 (without the digital feedbacks 402 and 404) may incorrectly write the comparison result for bit 9 to the output 253 (e.g., dnb<10>) again for bit 10 based on CLKS<10> being asserted as shown by the graph 504, where the curve 522 for dnb<10> transitions to a logic high at time T2. As explained above, having the same bit written twice with a logic 1 value can cause not only bit 10 to be in error, but all subsequent bits to be erroneous as well.

In contrast, the SAR logic circuitry 430 (with the digital feedbacks 402 and 404) may not write the comparison result for bit 9 to the output 253 (e.g., dnb<10>) again for bit 10 even though CLKS<10> remains asserted when the comparison result for bit 9 is ready as shown by the graph 504, where the curve 532 for dnb<10> remains a logic low at time T2. Accordingly, gating the comparator 120's positive output 202 $C_{op}$ and negative output 204 $C_{on}$ to a next downstream logic circuitry (e.g., the second logic circuitry 420)

by respective opposite polarity information (e.g., the digital feedback 402 for the positive output 202 and the digital feedback 404 for the negative output 204) can advantageously detect and eliminate the probabilistic error or the forbidden state.

Figure 6:
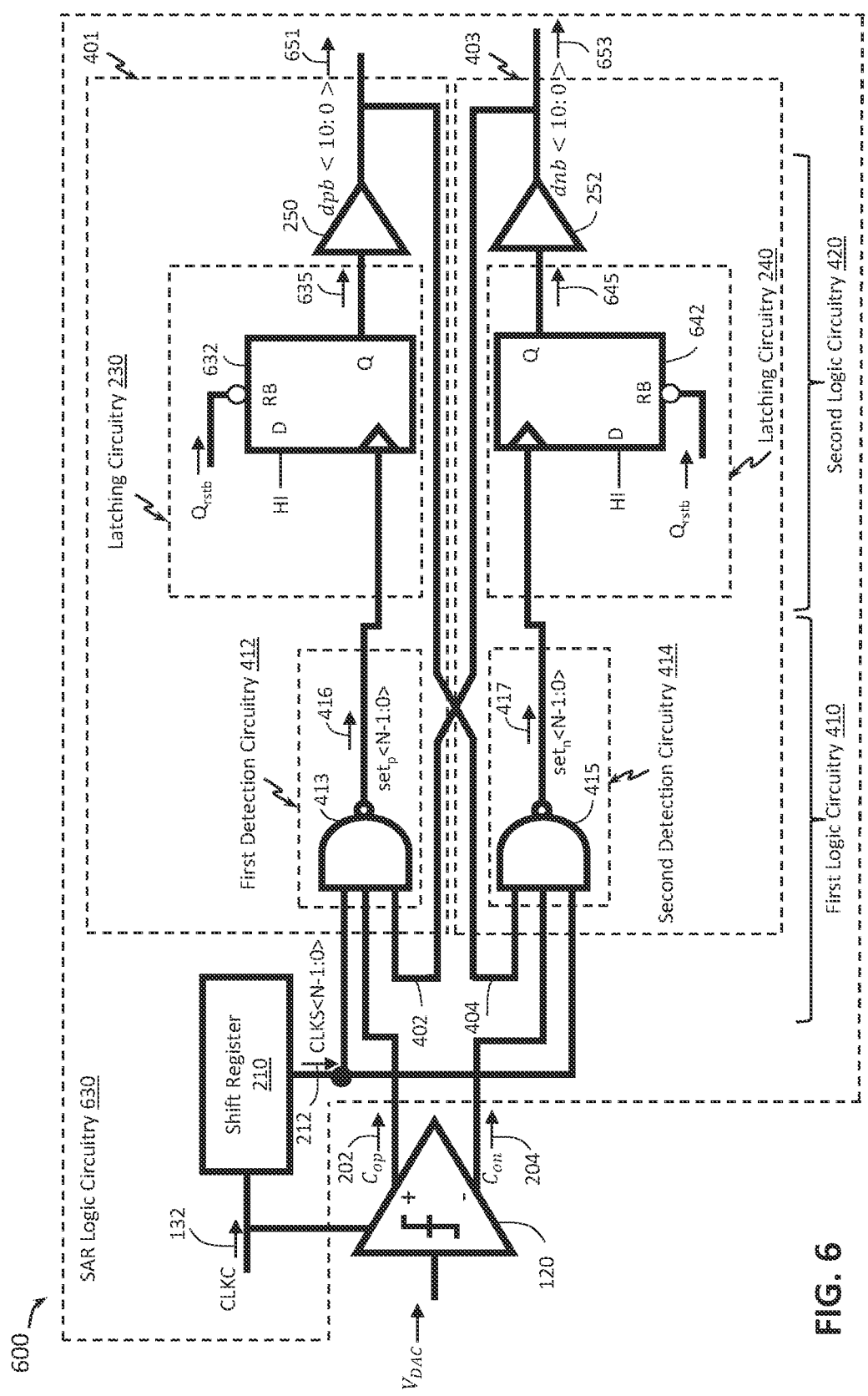
FIG. 6 is a schematic block diagram illustrating an exemplary SAR ADC portion that implements probabilistic error detection and elimination, according to some embodiments of the present disclosure.

FIG. 6 is a schematic block diagram illustrating an exemplary SAR ADC portion 600 that implements probabilistic error detection and elimination, according to some embodiments of the present disclosure. For instance, the SAR ADC portion 600 may correspond to a portion of the SAR ADC 100 of FIG. 1, where the SAR logic circuitry 630 may replace the SAR logic circuitry 130 shown in FIG. 1 and/or FIG. 2 to provide probabilistic error detection and elimination. The SAR ADC portion 600 shares many elements with the SAR ADC portion 400 of FIG. 4; for brevity, a discussion of these elements is not repeated, and these elements may take the form of any of the embodiments disclosed herein. For instance, the SAR ADC portion 600 may include SAR logic circuitry 630 coupled to the comparator 120 in the same way as the SAR logic circuitry 430 of FIG. 4. Further, the SAR logic circuitry 630 may have similar internal components and connections as the SAR logic circuitry 430, but the latching circuitries 230 and 240 are implemented using D flip-flops instead of SR flip-flops as in FIG. 4.

As shown in FIG. 6, the latching circuitry 230 is implemented using a D flip-flop 632 including an input shown by "D" (which may be referred to as a D input), a clock input shown by the triangle symbol, and an output shown by "Q" (which may be referred to as a Q output). The D input of the D flip-flop 632 is connected to a logic 1 or logic high (shown as Hl), the clock input of the D flip-flop 632 is coupled to the output 416 of the first gating circuitry 412 and the Q output 635 is coupled to the buffer gate 250. Similarly, the latching circuitry 240 is implemented using a D flip-flop 642 including a D input connected to a logic high, a clock input coupled to the output 417 of the second gating circuitry 414, and a Q output 645 coupled to the buffer 252. In general, the latching circuitry 230 and the latching circuitry 240 may be implemented using any suitable gates and logic circuitry (e.g., transistors) configured to latch or clock an input of the circuitry to the output of the circuitry.

Figure 7:
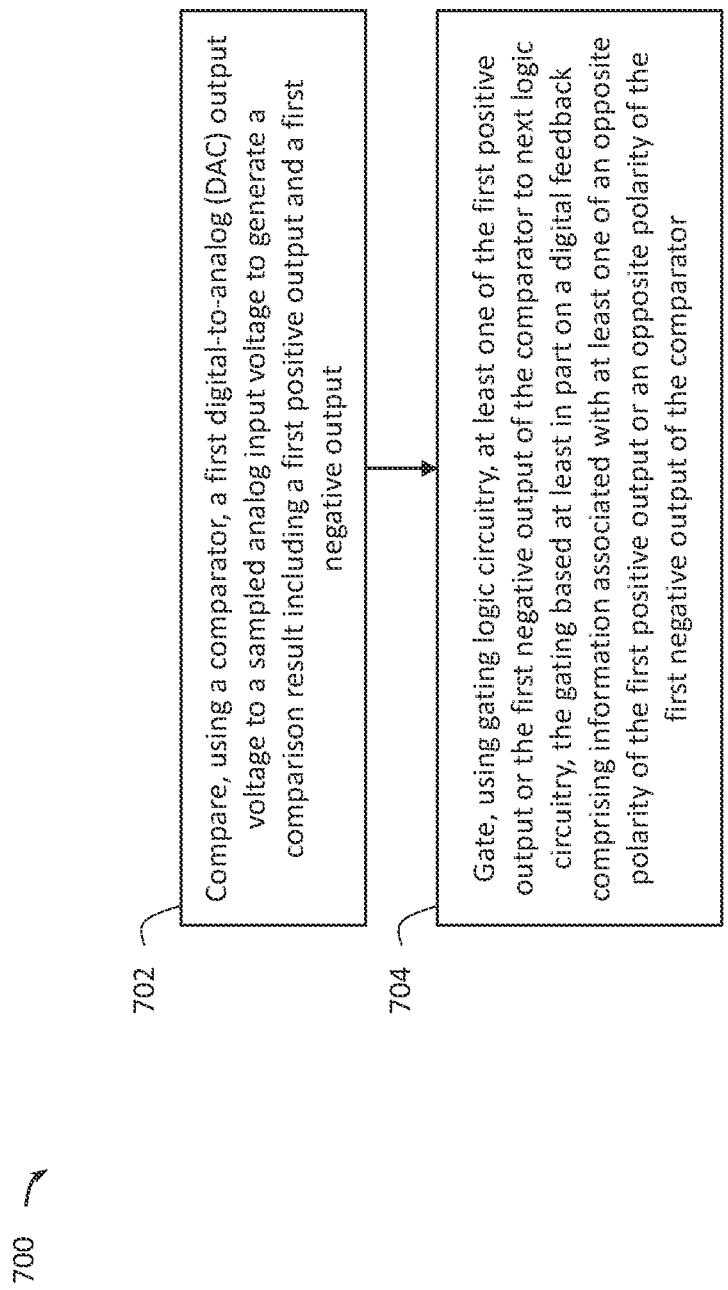
FIG. 7 is a flow diagram illustrating an exemplary method for performing SAR ADC operations, according to some embodiments of the present disclosure.

FIG. 7 is a flow diagram illustrating an exemplary method 700 for performing for SAR ADC operations, according to some embodiments of the present disclosure. The method 700 can be implemented by a SAR ADC (e.g., the SAR ADC 100, the SAR ADC portion 200, 400, and/or 600). The method 700 may utilize similar mechanisms as discussed above with reference to FIGS. 1-6. Although the operations of the method 700 may be illustrated with reference to particular embodiments of the SAR ADC disclosed herein, the method 700 may be performed using any suitable hardware components and/or software components. Operations are illustrated once each and in a particular order in FIG. 7, but the operations may be performed in parallel, reordered, and/or repeated as desired.

At 702, a first DAC output voltage may be compared to a sampled analog input voltage using a comparator (e.g., the comparator 120) to generate a comparison result including a first positive output and a first negative output. In some instances, the first DAC output voltage, the sampled analog input voltage, the first positive output, and the first negative output may correspond to the DAC output voltage 117, the sampled analog input voltage 113, the positive output 202, and the negative output 204, respectively. In some aspects, the first DAC output voltage may be generated using a switched capacitor DAC (e.g., the switched capacitor DAC 116) based on a digital output code.

At 704, at least one of the first positive output or the first negative output of the comparator may be gated to next logic circuitry using gating logic circuitry (e.g., the gating circuitries 412 and/or 414). The gating may be based at least in part on a digital feedback (e.g., the digital feedback 402 or 404) including information associated with at least one of an opposite polarity of the first positive output or an opposite polarity of the first negative output. In some aspects, the digital feedback may include an output of the next logic circuitry, where the output may be responsive to at least one of a second positive output or a second negative output of the comparator. For instance, the first positive output and the first negative output may be a comparison result for a current bit trial (e.g., for bit k), and the second positive output and the second negative output may be for a previous bit trial (e.g., for bit k−1).

In some aspects, the gating at 704 may include gating the first positive output (e.g., $C_{op}$<k>) of the comparator to the next logic circuitry further based on the output (e.g., dnb<k−1>) responsive to the second negative output (e.g., $C_{on}$<k−1>) of the comparator having a logic one value and the first positive output of the comparator having a logic one value. In some aspects, the gating may include gating the first negative output (e.g., $C_{on}$<k>) of the comparator to the next logic circuitry further based on the output (e.g., dpb<k−1>) responsive to the second positive output (e.g., $C_{op}$<k−1>) of the comparator having a logic one value and the first negative output of the comparator having a logic one value.

In some aspects, the gating at 704 may be further based on a detection of a shift register output clock pulse (e.g., the shift register output clock pulse 212 CLKS<k−1>) associated with the previous bit trial (e.g., for bit k−1) remaining active after the comparator generated the first positive output and the first negative output (for the current bit trial for bit k), for example, as shown in the graph 304 of FIG. 3 and/or the graph 502 of FIG. 5. In some aspects, for the previous bit trial, the method 700 may further include comparing a second DAC output voltage to the sampled analog input voltage to generate the second positive output and the second negative output and transmitting the second positive output and the second negative output to the next logic circuitry during the shift register output clock pulse. In some aspects, the comparing the second DAC output voltage to the sampled analog input voltage (for the previous bit trial) may be triggered in response to a first comparator clock pulse (e.g., the comparator output clock 132 CLKC<k−1>). The shift register output clock pulse may be triggered also in response to the same first comparator clock pulse. The comparing the first DAC output voltage to the sampled analog input voltage (for the current bit trial) may be triggered in response to a second comparator clock pulse (e.g., the comparator output clock 132 CLKC<k>) after the first clock pulse. In some aspects, the method 700 may further include resetting the comparator and the next logic circuitry after the previous bit trial.

EXAMPLES

In Example 1 include a method for performing successive approximation registers (SAR) analog-to-digital conversion. The method includes comparing, using a comparator, a first digital-to-analog (DAC) output voltage to a sampled analog input voltage to generate a comparison result including a first positive output and a first negative output; and gating, using gating logic circuitry, at least one of the first positive output or the first negative output of the comparator to next logic circuitry, the gating based at least in part on a digital feedback including information associated with at least one of an opposite polarity of the first positive output or an opposite polarity of the first negative output.

In Example 2, the subject matter of Example 1 can optionally include where the digital feedback includes an output of the next logic circuitry, the output responsive to at least one of a second positive output or a second negative output of the comparator.

In Example 3, the subject matter of any of Examples 1-2 can optionally include where the gating includes gating the first positive output of the comparator to the next logic circuitry further based on the output responsive to the second negative output of the comparator having a logic one value and the first positive output of the comparator having a logic one value.

In Example 4, the subject matter of any of Examples 1-3 can optionally include where the gating includes gating the first negative output of the comparator to the next logic circuitry further based on the output responsive to the second positive output of the comparator having a logic one value and the first negative output of the comparator having a logic one value.

In Example 5, the subject matter of any of Examples 1-4 can optionally include where the first positive output and the first negative output of the comparator are associated with a current bit trial; and the at least one of the second positive output or the second negative output of the comparator are associated with a previous bit trial.

In Example 6, the subject matter of any of Examples 1-5 can optionally include where the gating is further based on a detection of a shift register output clock pulse associated with the previous bit trial remaining active after the comparator generated the first positive output and the first negative output.

In Example 7. The method any of Examples 1-6 can optionally include comparing a second DAC output voltage to the sampled analog input voltage to generate the second positive output and the second negative output for the previous bit trial; and transmitting, during the shift register output clock pulse, the second positive output and the second negative output to the next logic circuitry.

In Example 8, the subject matter of any of Examples 1-7 can optionally include where the comparing the second DAC output voltage to the sampled analog input voltage is triggered in response to a first comparator clock pulse; the shift register output clock pulse is triggered in response to the first comparator clock pulse; and the comparing the first DAC output voltage to the sampled analog input voltage is triggered in response to a second comparator clock pulse after the first comparator clock pulse.

In Example 9, the subject matter of any of Examples 1-8 can optionally include resetting the comparator and the next logic circuitry after the previous bit trial.

In Example 10, the subject matter of any of Examples 1-9 can optionally include generating, using a switched capacitor digital-to-analog converter (DAC), the first DAC output voltage based on a digital output code.

Example 11 includes a successive approximation registers (SAR) analog-to-digital converter (ADC) including a digital-to-analog converter (DAC) to generate a first DAC output voltage based on a digital output code associated with an analog input voltage; a comparator to compare the first DAC output voltage to the analog input voltage to generate a comparison result including a first positive output and first negative output; and SAR logic circuitry including first logic circuitry to gate, based at least in part on a digital feedback, at least one of the first positive output or the first negative output of the comparator to second logic circuitry, the digital feedback including information associated with at least one of an opposite polarity of the a first positive output or an opposite polarity of the first negative output; and the second logic circuitry downstream of the first logic circuitry.

In Example 12, the subject matter of Example 11 can optionally include where the digital feedback includes an output of the second logic circuitry, the output responsive to at least one of a second positive output or a second negative output of the comparator.

In Example 13, the subject matter of any of Examples 11-12 can optionally include where the first positive output and the first negative output of the comparator are associated with a current bit trial; and the at least one of a second positive output or a second negative output of the comparator is associated with a previous bit trial.

In Example 14, the subject matter of any of Examples 11-13 can optionally include where the first logic circuitry further gates the at least one of the first positive output or the first negative output of the comparator to the second logic circuitry based on a detection of a shift register output clock pulse associated with the previous bit trial remaining active after the comparator generated the first positive output and the first negative output.

In Example 15, the subject matter of any of Examples 11-14 can optionally include where the comparator further compares a second DAC output voltage to the analog input voltage to generate the second positive output and the second negative output for the previous bit trial; and the first logic circuitry further transmits, during the shift register output clock pulse, the second positive output and the second negative output to the second logic circuitry.

In Example 16, the subject matter of any of Examples 11-15 can optionally include where the comparator compares the second DAC output voltage to the analog input voltage responsive to a first comparator clock pulse associated with the previous bit trial; the comparator compares the first DAC output voltage to the analog input voltage responsive to a second comparator clock pulse associated with the current bit trial; and the SAR logic circuitry further includes a shift register to generate the shift register output clock pulse responsive to the first comparator clock pulse.

In Example 17, the subject matter of any of Examples 11-16 can optionally include asynchronous clock generation circuitry to generate the first comparator clock pulse for the previous bit trial; and generate, responsive to a completion of the previous bit trial, the second comparator clock pulse for the current bit trial.

In Example 18, the subject matter of any of Examples 11-17 can optionally include where the first logic circuitry includes NOT-AND (NAND) circuitry to receive the first positive output or the first negative output of the comparator, the digital feedback, and a shift register output clock pulse.

In Example 19, the subject matter of any of Examples 11-18 can optionally include where the second logic circuitry includes reset circuitry, and where the digital feedback corresponds to an output downstream of the reset circuitry.

In Example 20, the subject matter of any of Examples 11-19 can optionally include where the DAC includes a switched capacitor DAC.

Example 21 includes a successive approximation registers (SAR) analog-to-digital converter (ADC) including an analog input to receive an analog input voltage; sample-and-hold circuitry coupled to the analog input; a digital-to-analog converter (DAC); a comparator coupled to an output of the sample-and-hold circuitry and an output of the DAC; and SAR logic circuitry including a shift register; a first digital path including first detection circuitry to receive one of a positive output or a negative output of the comparator, an output of the shift register, and a first digital feedback associated with a second digital path; and the second digital path including second detection circuitry to receive the other one of the positive output or the negative output of the comparator, the output of the shift register, and a second digital feedback associated with the first digital path.

In Example 22, the subject matter of Example 21 can optionally include where the first digital path further includes latching circuitry coupled to an output of the first detection circuitry, and where the second digital feedback corresponds to an output downstream of the latching circuitry.

In Example 23, the subject matter of any of Examples 21-22 can optionally include where the first detection circuitry gates the one of the positive output or the negative output of the comparator to the latching circuitry responsive to the first digital feedback.

In Example 24. The SAR ADC any of Examples 21-23 can optionally include where the first detection circuitry includes a NOT-AND (NAND) gate having a first input to receive the one of the positive output or the negative output of the comparator; a second input to receive the output of the shift register; and a third input to receive the first digital feedback.

In Example 25, the subject matter of any of Examples 21-24 can optionally include further including asynchronous clock generation circuitry to provide a comparator clock pulse to the comparator and the shift register.

In Example 26, the subject matter of any of Examples 21-25 can optionally include where the DAC includes a switched capacitor DAC.

Variations and Implementations

While embodiments of the present disclosure were described above with references to exemplary implementations as shown in FIGS. 1-7, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as comparator, DAC, S/H circuitry, shift register, NAND gates, SR flip flops, buffer gates, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to SAR ADCs, in various communication systems.

Parts of various systems for implementing SAR ADCs as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the SAR ADCs shown in FIGS. 1-2, 4, and 6) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. A method for performing successive approximation registers (SAR) analog-to-digital conversion, the method comprising:
   comparing, using a comparator, a first digital-to-analog (DAC) output voltage to a sampled analog input voltage to generate a comparison result including a first positive output and a first negative output; and
   gating, using gating logic circuitry, at least one of the first positive output or the first negative output of the comparator to next logic circuitry, the gating based at least in part on a digital feedback comprising information associated with at least one of an opposite polarity of the first positive output or an opposite polarity of the first negative output;
   wherein the digital feedback comprises an output of the next logic circuitry, the output responsive to at least one of a second positive output or a second negative output of the comparator; and
   wherein:
   the first positive output and the first negative output of the comparator are associated with a current bit trial; and
   the at least one of the second positive output or the second negative output of the comparator are associated with a previous bit trial.

2. The method of claim 1, wherein the gating comprises:
   gating the first positive output of the comparator to the next logic circuitry further based on the output responsive to the second negative output of the comparator having a logic one value and the first positive output of the comparator having a logic one value.

3. The method of claim 1, wherein the gating comprises:
   gating the first negative output of the comparator to the next logic circuitry further based on the output responsive to the second positive output of the comparator having a logic one value and the first negative output of the comparator having a logic one value.

4. The method of claim 1, wherein the gating is further based on a detection of a shift register output clock pulse associated with the previous bit trial remaining active after the comparator generated the first positive output and the first negative output.

5. The method of claim 4, further comprising:
   comparing a second DAC output voltage to the sampled analog input voltage to generate the second positive output and the second negative output for the previous bit trial; and
   transmitting, during the shift register output clock pulse, the second positive output and the second negative output to the next logic circuitry.

6. A successive approximation registers (SAR) analog-to-digital converter (ADC) comprising:
   a digital-to-analog converter (DAC) to generate a first DAC output voltage based on a digital output code associated with an analog input voltage;
   a comparator to compare the first DAC output voltage to the analog input voltage to generate a comparison result including a first positive output and first negative output; and
   SAR logic circuitry comprising:
      first logic circuitry to gate, based at least in part on a digital feedback, at least one of the first positive output or the first negative output of the comparator to second logic circuitry, the digital feedback comprising information associated with at least one of an opposite polarity of the a first positive output or an opposite polarity of the first negative output; and the second logic circuitry downstream of the first logic circuitry;

wherein the digital feedback comprises an output of the second logic circuitry, the output responsive to at least one of a second positive output or a second negative output of the comparator; and wherein:

the first positive output and the first negative output of the comparator are associated with a current bit trial; and the at least one of the second positive output or the second negative output of the comparator are associated with a previous bit trial.

7. The SAR ADC of claim 6, wherein the first logic circuitry further gates the at least one of the first positive output or the first negative output of the comparator to the second logic circuitry based on a detection of a shift register output clock pulse associated with the previous bit trial remaining active after the comparator generated the first positive output and the first negative output.

8. The SAR ADC of claim 7, wherein:

the comparator further compares a second DAC output voltage to the analog input voltage to generate the second positive output and the second negative output for the previous bit trial; and the first logic circuitry further transmits, during the shift register output clock pulse, the second positive output and the second negative output to the second logic circuitry.

9. The SAR ADC of claim 8, wherein:

the comparator compares the second DAC output voltage to the analog input voltage responsive to a first comparator clock pulse associated with the previous bit trial;

the comparator compares the first DAC output voltage to the analog input voltage responsive to a second comparator clock pulse associated with the current bit trial; and the SAR logic circuitry further comprises a shift register to generate the shift register output clock pulse responsive to the first comparator clock pulse.

10. The SAR ADC of claim 6, wherein the second logic circuitry comprises reset circuitry, and wherein the digital feedback corresponds to an output downstream of the reset circuitry.

11. A successive approximation registers (SAR) analog-to-digital converter (ADC) comprising:

an analog input to receive an analog input voltage;

sample-and-hold circuitry coupled to the analog input;

a digital-to-analog converter (DAC);

a comparator coupled to an output of the sample-and-hold circuitry and an output of the DAC; and SAR logic circuitry comprising:

a shift register;

a first digital path comprising:

first detection circuitry to receive one of a first positive output or a first negative output of the comparator, an output of the shift register, and a first digital feedback associated with a second digital path; and latching circuitry coupled to an output of the first detection circuitry;

the second digital path comprising:

second detection circuitry to receive the other one of the first positive output or the first negative output of the comparator, the output of the shift register, and a second digital feedback associated with the first digital path, wherein the second digital feedback corresponds to an output downstream of the latching circuitry; and wherein:

the first positive output and the first negative output of the comparator are associated with a current bit trial; and at least one of a second positive output or a second negative output of the comparator are associated with a previous bit trial.

12. The SAR ADC of claim 1, wherein the first detection circuitry gates the one of the first positive output or the first negative output of the comparator to the latching circuitry responsive to the first digital feedback.

13. The SAR ADC of claim 11, wherein the first detection circuitry comprises:

a NOT-AND (NAND) gate having:

a first input to receive the one of the first positive output or the first negative output of the comparator;

a second input to receive the output of the shift register; and a third input to receive the first digital feedback.

14. The SAR ADC of claim 11, further comprising:

asynchronous clock generation circuitry to provide a comparator clock pulse to the comparator and the shift register.

15. The SAR ADC of claim 11, wherein the DAC comprises a switched capacitor DAC.

16. The SAR ADC of claim 11, wherein the latching circuitry comprises reset circuitry, and wherein the second digital feedback corresponds to an output downstream of the reset circuitry.

17. The SAR ADC of claim 6, wherein the DAC comprises a switched capacitor DAC.

18. The SAR ADC of claim 6, wherein the first logic circuitry includes a NOT-AND (NAND) gate.

19. The SAR ADC of claim 6, comprising:

a shift register; and asynchronous clock generation circuitry to provide a comparator clock pulse to the comparator and the shift register.

* * * * *

UNITED STATES PATENT AND TRADEMARK OFFICE
CERTIFICATE OF CORRECTION

PATENT NO. : 11,888,498 B2  
APPLICATION NO. : 17/578253  
DATED : January 30, 2024  
INVENTOR(S) : Saari et al.

Page 1 of 1

It is certified that error appears in the above-identified patent and that said Letters Patent is hereby corrected as shown below:

In the Claims

In Column 22, Line 66, in Claim 6, delete "the a" and insert --the-- therefor

In Column 24, Line 24, in Claim 12, delete "claim 1," and insert --claim 11,-- therefor Signed and Sealed this  
Eighteenth Day of March, 2025

Coke Morgan Stewart  
*Acting Director of the United States Patent and Trademark Office*